(12) United States Patent
Bedell et al.

(10) Patent No.: US 10,417,519 B2
(45) Date of Patent: *Sep. 17, 2019

(54) ELECTRON CHANNELING PATTERN ACQUISITION FROM SMALL CRYSTALLINE AREAS

(71) Applicant: INTERNATIONAL BUSINESS MACHINES CORPORATION, Armonk, NY (US)

(72) Inventors: Stephen W. Bedell, Wappingers Falls, NY (US); Kunal Mukherjee, Goleta, CA (US); John A. Ott, Greenwood Lake, NY (US); Devendra K. Sadana, Pleasantville, NY (US); Brent A. Wacaser, Putnam Valley, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 31 days.

This patent is subject to a terminal disclaimer.

(21) Appl. No.: 15/797,366

(22) Filed: Oct. 30, 2017

(65) Prior Publication Data

US 2018/0211378 A1 Jul. 26, 2018

Related U.S. Application Data

(63) Continuation of application No. 15/413,532, filed on Jan. 24, 2017, now Pat. No. 10,127,649.

(51) Int. Cl.
| | | |
|---|---|---|
| *G06T 7/00* | (2017.01) | |
| *H01J 37/22* | (2006.01) | |
| *G06K 9/46* | (2006.01) | |
| *G06T 11/60* | (2006.01) | |
| *H01J 37/29* | (2006.01) | |
| *G06K 9/00* | (2006.01) | |
| *G06T 7/33* | (2017.01) | |

(52) U.S. Cl.
CPC ....... *G06K 9/4604* (2013.01); *G06K 9/00134* (2013.01); *G06T 7/33* (2017.01); *G06T 11/60* (2013.01); *H01J 37/222* (2013.01); *H01J 37/292* (2013.01); *G06T 2200/32* (2013.01); *G06T 2207/10016* (2013.01); *G06T 2207/10061* (2013.01); *G06T 2207/30148* (2013.01)

(58) Field of Classification Search
CPC ..... G06T 7/0004; G06T 11/60; G06K 9/4604; H01J 37/222; H01J 37/292
See application file for complete search history.

(56) References Cited

PUBLICATIONS

List of IBM Patents or Patent Applications Treated as Related dated Oct. 30, 2017, 2 pages.

*Primary Examiner* — David F Dunphy
(74) *Attorney, Agent, or Firm* — Tutunjian & Bitetto, P.C.; Erik Johnson

(57) ABSTRACT

A method for crystal analysis includes identifying a crystalline region on a device where an electronic channeling pattern is needed to be determined, acquiring a whole image for each of a plurality of different positions for the crystalline region using a scanning electron microscope (SEM) as the crystalline region is moved to different positions. Relevant regions are extracted from the whole images. The images of the relevant regions are stitched together to form a composite map of a full electron channeling pattern representative of the crystalline region wherein the electronic channeling pattern is provided due to an increase in effective angular range between a SEM beam and a surface of the crystal region.

15 Claims, 7 Drawing Sheets

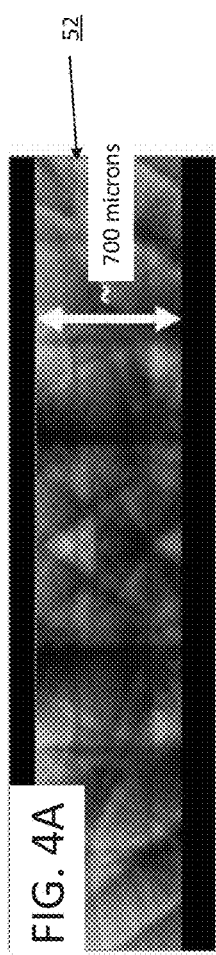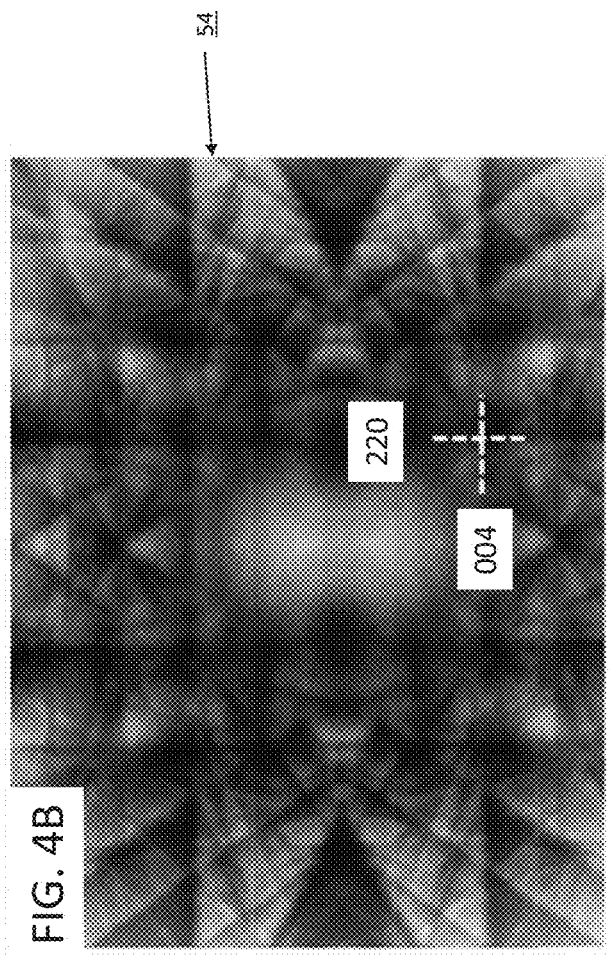

ELECTRON CHANNELING PATTERN ACQUISITION FROM SMALL CRYSTALLINE AREAS

BACKGROUND

Technical Field

The present invention generally relates to crystal analysis, and more particularly to systems and methods for acquiring images for identifying an electron channeling pattern in a crystalline material.

Description of the Related Art

Continued performance improvements in devices require heterogeneous integration of different materials, nanoscale fin geometry, as well as synthesis of metastable phases. Such techniques can be prone to crystalline defect generation which can have deleterious effects on device performance. Crystalline defects are most often not visible to conventional non-destructive techniques such as conventional scanning electron microscopy (SEM) and optical tools.

Methods for improving transistor performance include the introduction of permanent strain in a channel region using either external stressor or strained epitaxial channel layers. Along with the introduction of strain in complementary metal oxide semiconductor (CMOS) technology, comes greater susceptibility of forming dislocations during device processing. Detection of such dislocations and other crystallographic defects is conventionally achieved by transmission electron microscopy (TEM) which allows only limited statistics of defects, and their distribution due to the limited imaging area (typically <10×10 $\mu m^2$). However, for manufacturing control, the statistics of the distribution of defects from a much larger area is required because defects are known to affect performance and reliability adversely. Thus, the defect density needs to be lower than is typically feasible to statistically investigate by TEM. For example, for materials with high defect density a small area is needed to get adequate defect statistics, but for low defect densities (which are needed for manufacturing 'good' devices) larger areas are needed to acquire significant statistics on defect distribution and densities.

SUMMARY

In accordance with an embodiment of the present invention, a method for crystal analysis includes identifying a crystalline region on a device where an electronic channeling pattern is needed to determine the exact crystal orientation of the crystalline area with respect to the electron beam. A partial image of the whole electron channeling pattern (ECP) is acquired for each of a number of different positions of the crystalline region with respect to the electron beam using a scanning electron microscope (SEM). After a partial image of the ECP is acquired, the position of the crystalline region is translated using the SEM stage to physically move the crystalline region to an at least one new location in the SEM microscope and an at least second image is taken with the SEM. The partial images of the ECP are stitched together to form a composite map of a larger portion of the ECP. This larger area of the ECP provides an increase in effective angular range between a SEM beam and a surface of the crystalline region allowing for more accurate identification of crystal structure and orientation.

Another method for crystal analysis includes identifying a crystalline region on a device where an electronic channeling pattern is needed to be determined, and acquiring a whole image for each of a plurality of different positions for the crystalline region using a scanning electron microscope (SEM) as the crystalline region is moved to different positions. Relevant regions are extracted from the whole images. The images of the relevant regions are stitched together to form a composite map of a full electron channeling pattern representative of the crystalline region wherein the electronic channeling pattern is provided due to an increase in effective angular range between a SEM beam and a surface of the crystal region.

Yet another method for crystal analysis includes identifying a crystalline region on a device where electronic channeling pattern is needed to be determined; stepping through a plurality of positions for the crystalline region by adjusting a location where a sample is located while a scanning electron microscope (SEM) image is to be taken; acquiring a whole image for each of the plurality of different positions of the crystalline region using the SEM; processing the whole images to stitch together a composite map of the crystalline region at different locations; and displaying a full electronic channeling pattern on a display.

A system for crystal analysis includes a scanning electron microscope (SEM) configured to scan a crystalline region of a device and a stage configured to mount the device and to step the device through a plurality of imaging positions on the crystalline region. A memory device includes imaging software configured to store whole images taken at each of the plurality of imaging positions on the crystalline region; extract portions of the whole image; and stitch the portions of the whole images together to form a composite map of the crystal region wherein a full electronic channeling pattern is provided in the composite map due to an increase in effective angular range between a SEM beam and a surface of the crystal region.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 4A shows an electron channeling map collected on a cleaved (110) cross-section of a silicon wafer in accordance with an embodiment of the present invention;

FIG. 4B shows a full electron channeling map collected on the cleaved (110) cross-section of a silicon wafer in accordance with an embodiment of the present invention;

DETAILED DESCRIPTION

Figure 1:
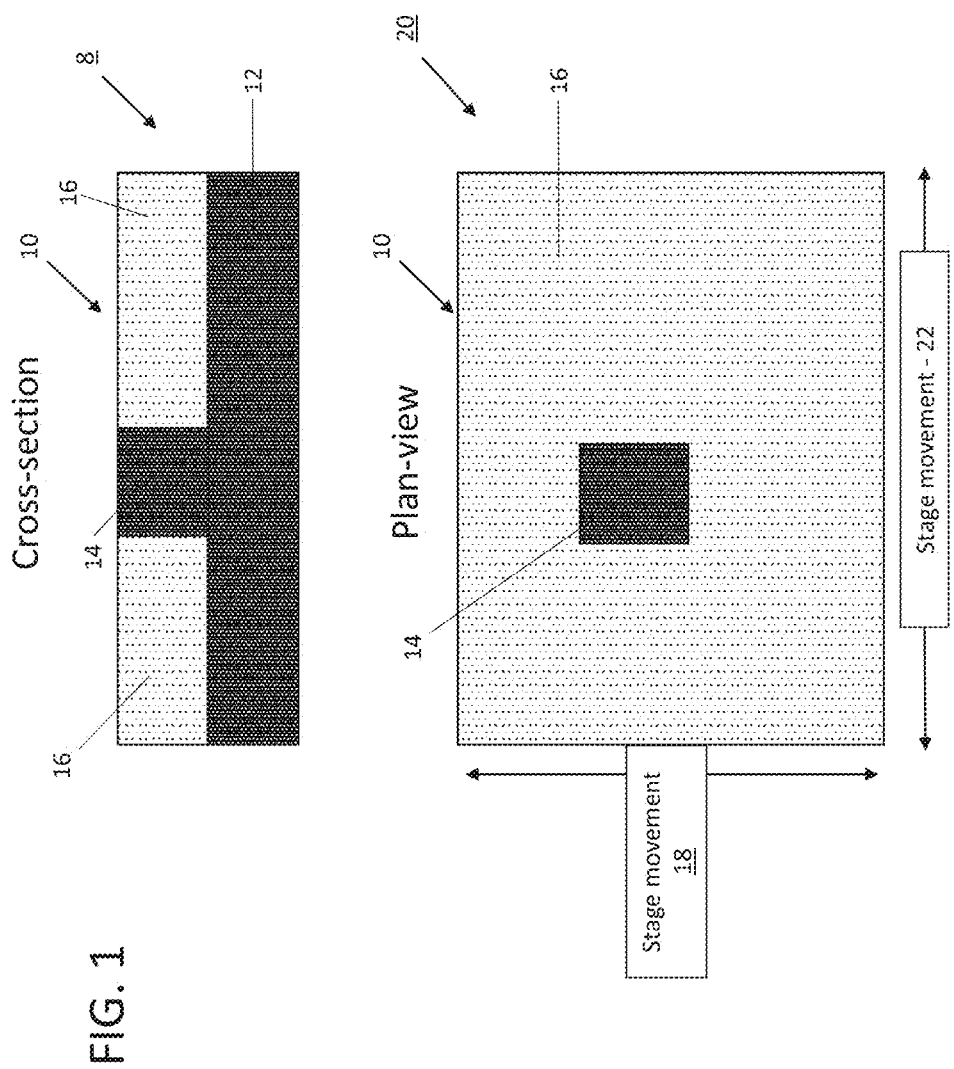
FIG. 1 is a cross-sectional view and plan view of a device or sample on a substrate or wafer and having a small crystalline region where an electron channeling pattern needs to be identified in accordance with an embodiment of the present invention.

In accordance with embodiments of the present invention, systems and methods are provided for determining electron channel patterns on samples with only small areas of crystalline material. In particularly useful embodiments, electronic channel patterns are employed to determine exact alignment of the crystalline material and the electron beam in an SEM to acquire electron channeling contrast images (ECCI) which help to map and detect defects in crystal/crystalline materials. To determine crystal structure and orientation, a plurality of images of partial ECP images are stitched together to create a complete map or full ECP for a substrate, chip or device.

In accordance with one embodiment, ECCI is employed as a technique for rapid and high resolution characterization of individual crystalline defects in a scanning electron microscope (SEM). However, in accordance with the present embodiments, the ECCI application is no longer limited to bare semiconductor material samples in plan-view geometry. Instead, new modalities of ECCI techniques are provided herein with relevance to semiconductor manufacturing and failure analysis.

ECCI can also be employed to reveal misfit dislocation defects along a cleaved cross-section of a compositionally graded buffer (e.g., SiGe grown on Si). Plan-view imaging can be performed on patterned materials where only a small region or small regions of the crystalline material are present at the surface of the semiconductor device (e.g., SiGe/Si fins). The present embodiments permit the use of ECCI in inspecting crystallographic defects non-destructively and in a high throughput mode which is highly desirable for substrate quality control in manufacturing of products based on crystalline materials.

ECCI is highly effective in imaging defects with a spatial resolution similar to that of TEM. ECCI uses the variation in back-scattered electron (BSE) yield related to changes in the channeling of the electrons caused by lattice distortions around crystalline defects, which is greatest when a sample is aligned to a Bragg condition. Precise sample alignment is determined using the electron channeling pattern that results when the electron beam scans across the sample impinging at a range of angles. In backscattering geometry with a pole-piece mounted BSE detector, large areas of exposed single crystal sample area are traditionally necessary to obtain a wide range of beam-sample angles and hence a useful electron channeling map.

Thus far, ECCI imaging in semiconductors has been restricted to plan-view images on blanket films to view both misfit and threading dislocations. In accordance with the present embodiments, ECP images can be taken to enable ECCI to be employed in a plan-view mode on patterned devices with only small areas of the crystalline material or a cross-sectional mode to view misfit and threading dislocations in crystalline materials including a compositionally graded buffer (e.g., $Si/Si_{0.8}Ge_{0.2}$) over areas much larger than is possible with TEM with no sample preparation beyond a simple cleave. Thin layers of $SiO_2$ that normally reduce channeling contrast can be present and still permit for dislocation imaging without loss of resolution.

ECCI is a non-destructive advanced SEM-based technique that can be employed to characterize crystalline defects, offering advantages over destructive techniques such as TEM. The ECP is useful to determine the correct tilt for channeling contrast. Single crystal material requires areas greater than 100 s of square microns to be exposed to see the channeling pattern. There are no convenient solutions to obtain channeling patterns using a regular SEM that does not involve beam rocking.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can be employed for evaluating a design for an integrated circuit chip, where the design can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe, III-V materials including InAs, GaAs, GaP InP, InGaAs, etc. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another elements) or feature(s) as illustrated in the FIGS. It will be understood that the spatially relative terms are intended to encompass different orientations of the device in use or operation addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a cross-sectional view 8 and a plan view 20 of a semiconductor device or sample 10 are illustratively shown. The device 10 includes a substrate or wafer 12. The substrate 12 can include any suitable substrate structure, e.g., a bulk semiconductor, a semiconductor-on-insulator (SOI) substrate, etc. In one example, the substrate 12 can include a silicon-containing material. Illustrative examples of Si-containing materials suitable for the substrate 12 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

The substrate 12 includes a crystalline structure (e.g., monocrystalline). The substrate 12 can be etched to form a crystalline region or portion 14, or the crystalline portion 14 can be grown through an amorphous or non-crystalline layer 16. The layer 16 can include an amorphous form of the substrate material, a dielectric material, e.g., an oxide, any other non-crystalline material or a crystalline material not of interest. The portion 14 and the substrate 12 below the layer 16 are the target for electronic channel patterning (ECP) as these components include a crystallographic structure. In a particularly useful embodiment, the region 14 is a small size. The small size refers to being smaller than needed to obtain a full ECP pattern (which can be an area of 100's of square microns), and more particularly less than about 10×10 µm$^2$).

A scanning electron microscope will be employed from over the plan view 20 to scan the device 10. The crystalline region 14 is demarcated on the wafer whose ECP is desired. Scanning the device 10 includes a raster of a stage motor (not shown) to acquire a whole image for each raster step. The device 10 is mounted on a stage or platform that can be subjected to y direction and x direction (and z-direction, if needed) scanning or stage movement 18, 22, respectively. The SEM imaging conditions are adjusted to the settings needed to acquire an ECP. The complete image can include exposed or covered crystalline material (e.g., of the exposed substrate 12 (region 14) or the covered (layer 16) substrate.

Figure 2:
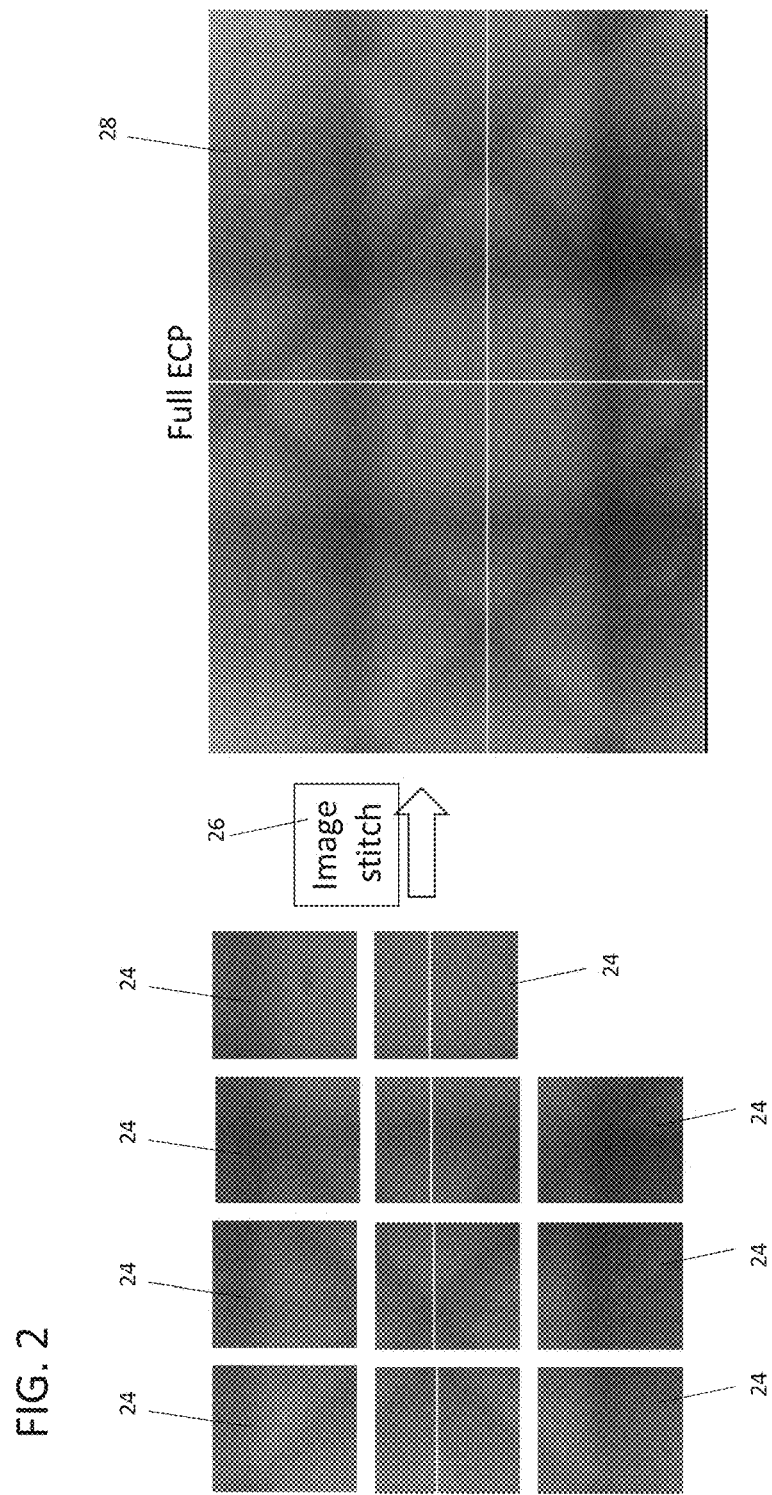
FIG. 2 shows an array of partial images of the ECP taken with the crystalline region of FIG. 1 (or FIG. 3) translated to different positions in the SEM, and these images are stitched together by a stitch program to form a full electron channeling pattern image in accordance with an embodiment of the present invention.

Referring to FIG. 2 with continued reference to FIG. 1, the portion of the ECP is only evident where the crystalline material of interest 14 is exposed. The complete image is cropped and only the portion 24 of the ECP is extracted with the location of the stage position indicated for reference. The sample is now translated at least once in x and/or y to a new stage position and an at least one new image is acquired. The crystalline region in the at least second image 24 now depicts a portion of the ECP related to the new position and the angular orientation change of the scanning beam associated with this new position. A relevant portion 24 of the ECP pattern is extracted from the complete image at each new stage position. The portions 24 of the ECP are arranged with respect to the stage position for each portion as in FIG.

2. As the stage moves, portion images are collected for each desired location. The full ECP 28 is generated by stitching each extracted portion image 24 together forming a composite image.

An electron channeling pattern (ECP) can be obtained when imaging along the portion 14. Due to the absence of a large enough area for the full channeling pattern, a truncated channeling pattern is exhibited in the portion 14. To obtain the full channeling map (full ECP), several images 24 of the partial electron channeling pattern are acquired by translating the sample 10 parallel to the substrate or wafer 12 thickness using movement of the stage where the sample or device 10 is mounted. The plurality of images at the different locations increases the effective angular range between the SEM beam and the surface of the sample 10 and reveals aspects of the ECP.

A complete map (full ECP) 28 is generated by compositing the plurality of portion images 24 together. This image 28 is similar to what could be obtained with a substrate that had a much larger continuous area of crystalline material of interest. Each image 24 is collected at a different stage location with the crystalline region 14 acting as a window to the full ECP channeling map 28. The window provides a clearer image of the crystal structure and can be employed to better stitch together the other images. The system can automatically stitch together the full ECP 28 from the images 24 using the visible demarcated portion 14 of the ECP.

The full ECP 28 is obtained by compositing the images 24 using an image stitch program or algorithm 26. Once generated, channeling bands are indicated in the channeling pattern 28. The presence of higher order bands indicates the high quality of the surface.

In another embodiment, the e-beam of the SEM may be rastered only in the demarcated area (14). The stage is concurrently moved while acquiring images only of the demarcated area (region 14). Then, the full ECP 28 can be stitched together using only the portion 14 of the ECP visible in the demarcated area.

Figure 3:
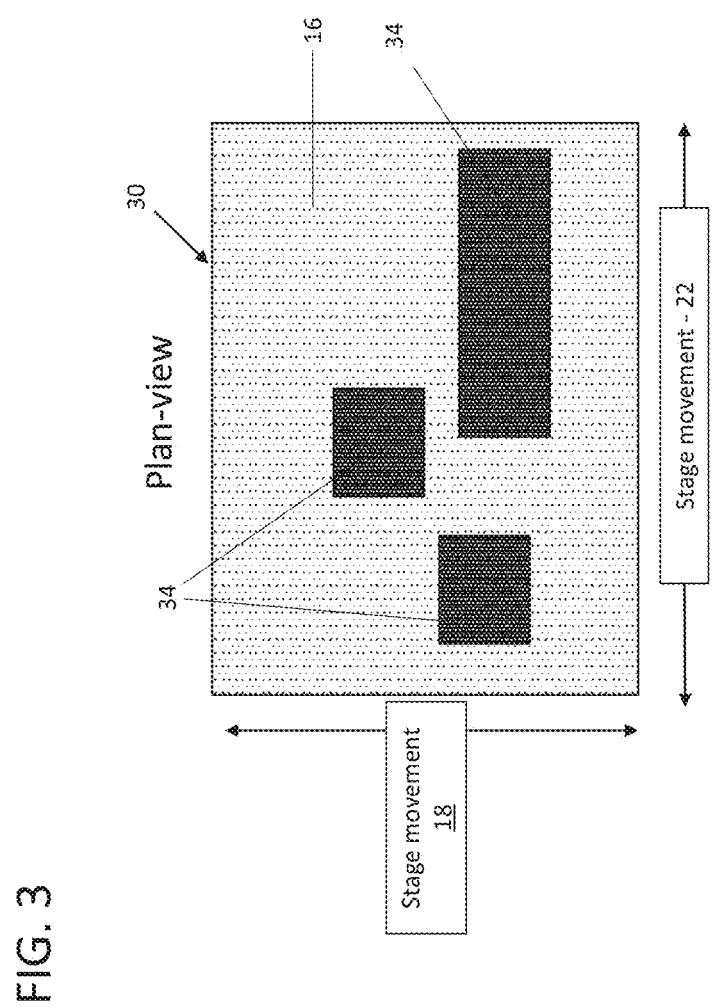
FIG. 3 is a plan view of a device or sample on a substrate or wafer and having a plurality of small crystalline regions where an electron channeling pattern needs to be identified in accordance with an embodiment of the present invention.

Referring to FIG. 3, in another embodiment, if multiple disconnected crystalline areas 34 are visible, all areas or a subset of areas can be demarcated. Then, the stage motor can be stepped across the visible fields in a manner so as to avoid repeatedly collecting portions of ECP images. The final full ECP can be stitched from the images collected across the areas 34 in the same manner as described.

The accuracy of the stepper motor of the stage determines the accuracy of the ECP. The more images taken the greater the accuracy of the full ECP. Low quality ECP images are acceptable to obtain the tilt angle. The ECP can be employed to learn about the crystal structure, discover defects or identify other issues related to the crystal structure and orientation of the samples or device. The present embodiments employ non-destructive SEM imaging to provide highly accurate ECP maps comparable to those obtained with more destructive techniques (e.g., TEM).

Referring again to FIG. 1, another embodiment includes imaging a cross section (view 8) of a sample 10 where a full ECP cannot be imaged because the cross section of the material (14) is smaller than the ECP. Therefore, the sample can be translated and multiple images stitched to create a full ECP as described above for patterned samples in other embodiments. Such samples can be cleaved to expose the cross-section for destructive testing.

Testing for such an embodiment is described in accordance with illustrative examples. In one example, SiGe samples were synthesized using reduced pressure chemical vapor deposition (RPCVD) at a temperature of about 800° C. with $SiH_2Cl_2$ and $GeH_4$ as precursors. To demonstrate ECCI in cross-sectional geometry, a 4.5 micron compositionally graded buffer was grown on Si, with a surface composition of $Si_{0.8}Ge_{0.2}$. The sample was scribed and cleaved by hand in a laboratory ambient, exposing the (110) plane. Subsequent chemical cleaning procedures were not used.

Referring to FIGS. 4A and 4B, a 20 kV electron channeling map 52 is illustratively shown that was collected on the cleaved (110) cross-section of the silicon wafer. The wafer thickness is ~700 micrometers (FIG. 4A). A composite image 54 (FIG. 4B) created by combining partial electron channeling pattern images collected by translating the sample as described above but in the vertical direction is also shown. The 220 and 004 channeling lines are indicated.

Image 52 (FIG. 4A) shows an electron channeling pattern (ECP) obtained when imaging along the cleaved (110) cross-section of the silicon substrate. Due to the absence of a large enough area for the full channeling pattern, the 700 µm substrate thickness exhibits a truncated channeling pattern. It can be challenging to tilt the sample to the desired Bragg condition using only a partial view of the channeling map. To circumvent this, several images of the partial electron channeling pattern were acquired by translating the sample parallel to the substrate thickness. This increased the effective angular range between the beam and the sample surface and a complete map was generated by compositing the images together.

Image 54 (FIG. 4B) shows the channeling map obtained by compositing six images. The 220 and 004 channeling bands are indicated. The presence of higher order 440 and 660 bands indicate the high quality of the cleaved surface.

Figure 5:
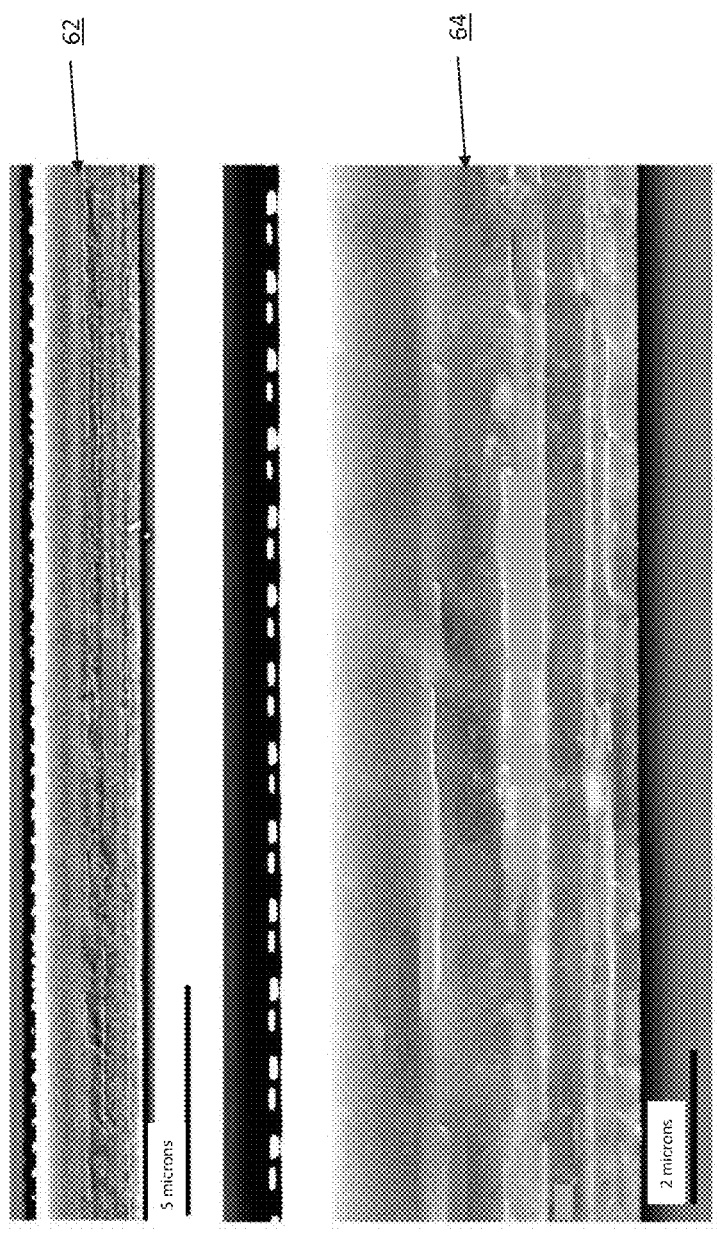
FIG. 5 shows images of a sample tilted to a Bragg condition located at an intersection of the 220 and 004 Kikuchi bands shown in cross-section at two different scales, 5 microns and 2 microns to demonstrate embodiments of the present invention.

Referring to FIG. 5, a sample is shown that was tilted to a Bragg condition located at the intersection of the 220 and 004 Kikuchi bands shown in cross-section at two different scales, 5 microns (image 62) and 2 microns (image 64). The range of conditions accessible was limited by the single tilt axis of the stage. The backscatter yield of Ge is greater than that of Si and hence the BSE signal increased with layer height, an effect not encountered in plan-view samples. The magnitude of ECCI contrast was weak compared to the compositional contrast but the slowly varying nature of the compositional contrast permitted background subtraction. A high-pass filter was used to remove only features with a length greater than 100 nm. The image contrast and brightness were then adjusted. A 20 µm wide view of the SiGe layer revealed regularly spaced misfit dislocations. The stage was translated across millimeters of the sample cross-section while staying at the Bragg condition. Inspection of large areas in cross-section, similar to plan-view ECCI, was demonstrated with misfit dislocations clearly visible in the images, with misfit dislocations perpendicular to the plane of the image also being visible with contrast similar to threading dislocations. Misfit dislocations lying below the Si/SiGe interface highlighted the advantages of cross-sectional ECCI as an inspection tool.

The use of electron channeling contrast in an SEM allows for rapid characterization of crystalline defects over areas much larger than those possible with TEM samples. The use of the technique can be extended to cleaved cross-sectional samples with only small areas of exposed crystalline material. To enable ECCI in these conditions, the ECP was acquired using multiple images and translating the stage.

The present embodiments can be employed as supplementary to traditional focused ion beam (FIB) and TEM-based defect analysis and can even inform the location of TEM sample preparation.

Figure 6:
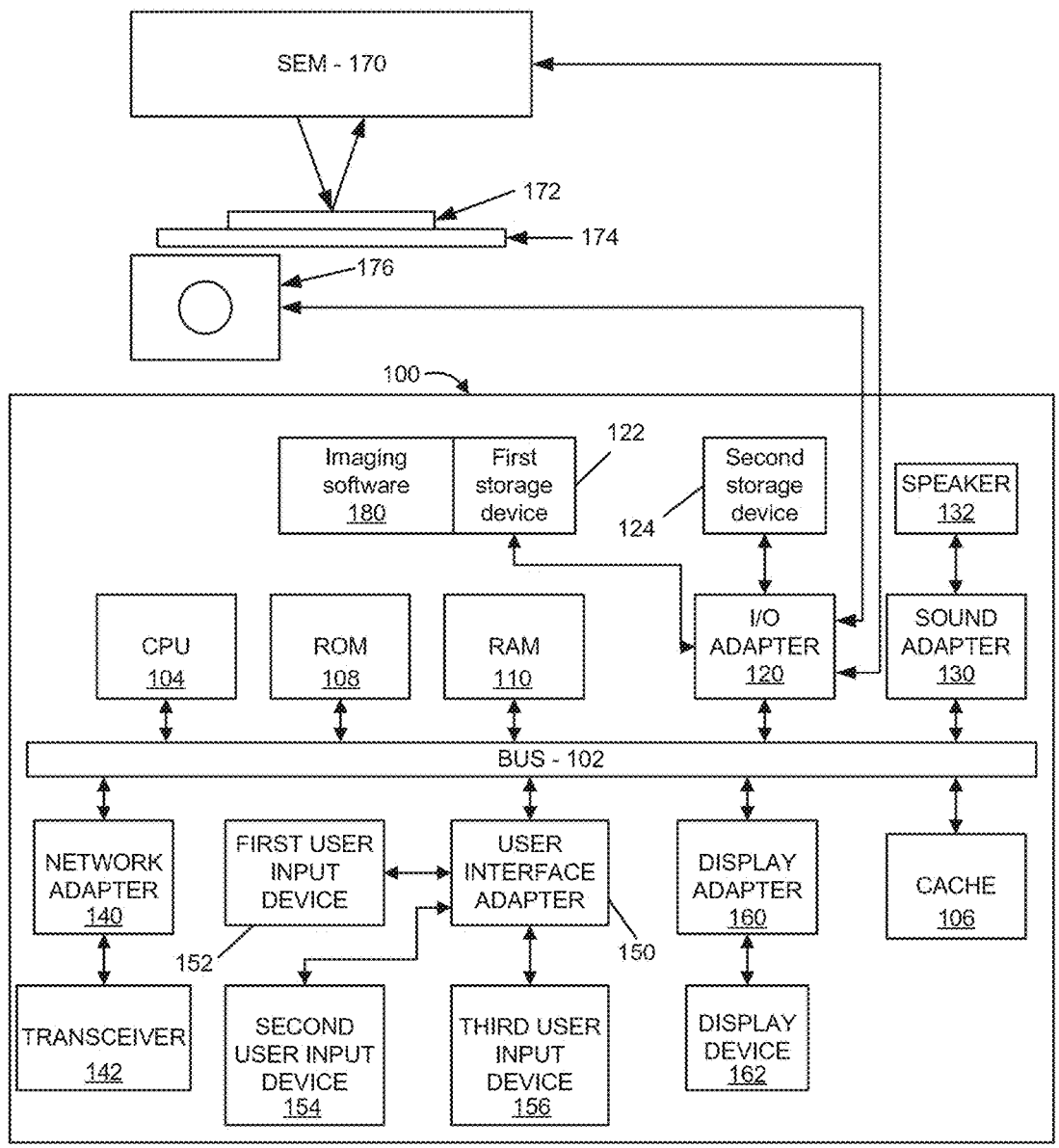
FIG. 6 is a block/flow diagram showing a scanning electron microscope and processing system in accordance with an embodiment of the present invention.

Referring to FIG. 6, an exemplary processing system 100 working in conjunction with a SEM 170 to which the present invention may be applied is shown in accordance with one embodiment. The processing system 100 includes at least one processor (CPU) 104 operatively coupled to other components via a system bus 102. A cache 106, a Read Only Memory (ROM) 108, a Random Access Memory (RAM) 110, an input/output (I/O) adapter 120, a sound adapter 130, a network adapter 140, a user interface adapter 150, and a display adapter 160, are operatively coupled to the system bus 102.

A first storage device 122 and a second storage device 124 are operatively coupled to system bus 102 by the I/O adapter 120. The storage devices 122 and 124 can be any of a disk storage device (e.g., a magnetic or optical disk storage device), a solid state magnetic device, and so forth. The storage devices 122 and 124 can be the same type of storage device or different types of storage devices.

A speaker 132 can be operatively coupled to system bus 102 by the sound adapter 130. A transceiver 142 is operatively coupled to system bus 102 by network adapter 140. A display device 162 is operatively coupled to system bus 102 by display adapter 160.

A first user input device 152, a second user input device 154, and a third user input device 156 are operatively coupled to system bus 102 by user interface adapter 150. The user input devices 152, 154, and 156 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present invention. The user input devices 152, 154, and 156 can be the same type of user input device or different types of user input devices. The user input devices 152, 154, and 156 are used to input and output information to and from system 100.

Of course, the processing system 100 may also include other elements (not shown), as readily contemplated by one of skill in the art, as well as omit certain elements. For example, various other input devices and/or output devices can be included in processing system 100, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 100 are readily contemplated by one of ordinary skill in the art given the teachings of the present invention provided herein.

A scanning electron microscope (SEM) 170 is coupled to the system 100, e.g., to the I/O adapter 120. System 100 controls the SEM 170, one or more stepper motors 176 and any other devices and functions on the SEM 170. The system 100 coordinates movement of a stage 174 in one, two or three dimensions by employing the one or more stepper motors 176 to appropriately position the stage. A sample or device 172 is placed on the stage 174 for failure mode analysis, characterization of channel patterns, or any other ECCI related imaging. The sample 172 includes crystal structures to be evaluated or characterized. The motor 176 is synchronized with image collection of the SEM 170 to provide a plurality of images over one or more regions of the sample or device 172. The images are stored in memory (e.g., first storage device 122).

Imaging software 180 is employed to extract relevant portions of the images and stitch together the images by aligning pixel patterns, position data or a combination thereof. The imaging software 180 is employed to create a full ECP map from a number of smaller images as described herein. The imaging software 180 can include contrast, color/black and white controls, filters (e.g., high pass filters for removing uniform regions to focus on defects, etc.) and other visualization functions and image processing algorithms to highlight different aspects of the images (e.g., ECP definition, defect identification, etc.).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 7:
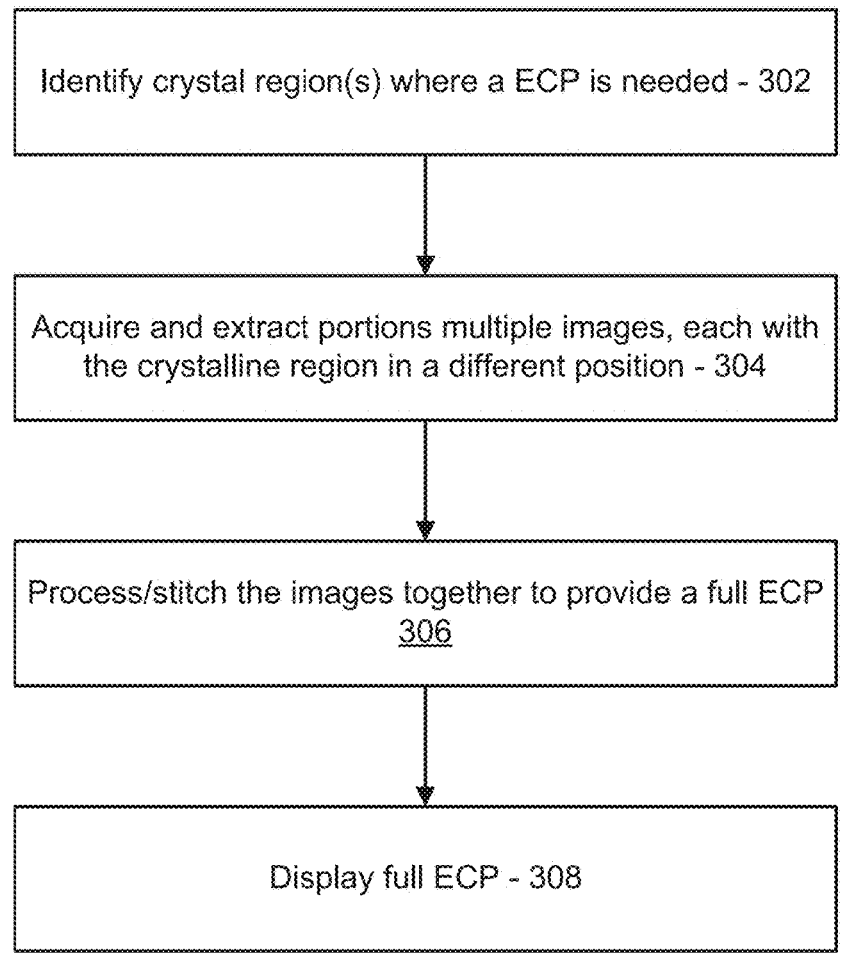
FIG. 7 is a block/flow diagram showing methods for analyzing crystals in accordance with embodiments of the present invention.

Referring to FIG. 7, methods for crystal analysis including electron channeling pattern acquisition from crystalline areas are illustratively shown. The methods for crystal analysis include identifying a crystal or crystalline region on a device where an electronic channeling pattern is needed to be determined. The system of FIG. 6 may be employed to carry out these methods. A whole image is acquired for each of a number of different positions for the crystal region using a scanning electron microscope (SEM). The crystalline region is moved to each new position with a stepper motor or other movement apparatus. Relevant portions of the whole images are extracted to remove any area that does not display a portion of the electron channeling pattern. The images portions are stitched together to form a composite map of the full electron channeling pattern, the electronic channeling pattern is provided due to an increase in effective area and angular range between a SEM beam and a surface of the crystalline region. The crystalline region can be buried below a thickness of non-crystalline material and the whole image can be acquired through the non-crystalline material.

In a particularly useful embodiment, in block 302, one or more crystal or crystalline regions are identified on a device where an electronic channeling pattern is needed to be determined.

In block 304, a whole image is acquired for each of a plurality of different positions for the crystalline region using a scanning electron microscope (SEM) as the crystalline region is moved to different positions. The whole image includes a full resolution image for each position in question. This can be adjusted in accordance with the capabilities of the SEM or in accordance with the acquisition plan (e.g., number of positions where the images are acquired, etc.). The whole image can be acquired by stepping through different positions using a stepper motor to change positions in at least two dimensions.

Relevant portions of the whole images are extracted to remove any area that does not display a portion of the electron channeling pattern. This can also include removing redundant portions or selecting a best version or versions of redundant portions (and removing the others). The whole image can be acquired with a plurality of different exposed crystalline regions on a same substrate or wafer, or a crystalline region of cross-sectioned device (e.g., cleaved for cross sectional analysis) can be employed.

In block 306, the ECP portions from the crystalline regions of the whole images are processed and/or stitched together to form a composite map of the full electron channeling pattern representative of the crystal structure and orientation of the exposed crystalline region. This gives an increase in effective angular range between a SEM beam and a surface of the crystal region. The use of many images permits scanning electrons at different angles to obtain more features in the images. In useful embodiments, the crystalline region or regions are smaller than an area needed to view a full electronic channeling pattern for the device. The area needed to view the full electronic channeling pattern can be hundreds of square microns. The present embodiments can expand a small area (e.g., as low as 10 nm on a side) into a full electronic channeling pattern.

In block 308, the composite map can be displayed on a display device to show a full electronic channeling pattern for the device. The full electronic channeling pattern permits the alignment of the electron beam into a known channeling condition. The present embodiments can be used in combination with electron channeling contrast imaging after the proper alignment permits identification of defects in at least the crystal region of the device.

Having described preferred embodiments for electron channeling pattern acquisition from small crystalline areas (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for crystal analysis, comprising:
    identifying a crystalline region on a device where an electronic channeling pattern is needed to be determined;
    acquiring a whole image for each of a plurality of different positions for the crystalline region using a scanning electron microscope (SEM) as the crystalline region is moved to different positions;
    extracting relevant regions from the whole images; and
    stitching the images of the relevant regions together to form a composite map of a full electron channeling pattern representative of the crystalline region wherein the electronic channeling pattern is provided due to an increase in effective angular range between a SEM beam and a surface of the crystal region.

2. The method as recited in claim 1, wherein the crystalline region is smaller than an area needed to view a full electronic channeling pattern for the device.

3. The method as recited in claim 1, wherein the crystalline region is buried below a thickness of non-crystalline material and acquiring the whole image includes acquiring the whole image through the non-crystalline material.

4. The method as recited in claim 1, wherein acquiring the whole image includes stepping through different positions using a stepper motor to change positions in at least two dimensions.

5. The method as recited in claim 1, wherein acquiring the whole image includes acquiring the whole image at a plurality of different exposed crystal regions on a same substrate or wafer.

6. The method as recited in claim 1, wherein acquiring the whole image includes acquiring the whole image for a crystalline region of cross-sectioned device.

7. The method as recited in claim 1, wherein the composite map displays a full electronic channeling pattern for the device.

8. The method as recited in claim 1, wherein the composite map identifies crystal structure and orientation of the device.

9. A method for crystal analysis, comprising:
    identifying a crystalline region on a device where electronic channeling pattern is needed to be determined;
    stepping through a plurality of positions for the crystalline region by adjusting a location where a sample is located while a scanning electron microscope (SEM) image is to be taken;
    acquiring a whole image for each of the plurality of different positions of the crystalline region using the SEM;
    processing the whole images to stitch together a composite map of the crystalline region at different locations; and
    displaying a full electronic channeling pattern on a display.

10. The method as recited in claim 9, wherein the crystalline region is smaller than an area needed to view a full electronic channeling pattern for the device.

11. The method as recited in claim 9, wherein the crystalline region is buried below a thickness of non-crystalline material and acquiring the whole image includes acquiring the whole image through the non-crystalline material.

12. The method as recited in claim 9, wherein stepping includes stepping through different positions using a stepper motor to change positions in at least two dimensions.

13. The method as recited in claim 9, wherein acquiring the whole image includes acquiring the whole image at a plurality of different exposed crystalline regions on a same substrate or wafer.

14. The method as recited in claim 9, wherein acquiring the whole image includes acquiring the whole image for a crystalline region of cross-sectioned device.

15. The method as recited in claim 9, wherein the composite map identifies a crystal structure and orientation of the device.

* * * * *